US009101929B2

(12) United States Patent
Ehrenpfordt et al.

(10) Patent No.: US 9,101,929 B2
(45) Date of Patent: Aug. 11, 2015

(54) MICROFLUIDIC SYSTEM FOR PURPOSES OF ANALYSIS AND DIAGNOSIS AND CORRESPONDING METHOD FOR PRODUCING A MICROFLUIDIC SYSTEM

(75) Inventors: Ricardo Ehrenpfordt, Zwickau (DE); Mathias Bruendel, Stuttgart (DE); Frieder Haag, Wannweil (DE); Jochen Rupp, Stuttgart (DE); Ulrike Scholz, Korntal (DE)

(73) Assignee: Robert Bosch GmbH, Stuttgart (DE)

( * ) Notice: Subject to any disclaimer, the term of this patent is extended or adjusted under 35 U.S.C. 154(b) by 380 days.

(21) Appl. No.: 13/050,762

(22) Filed: Mar. 17, 2011

(65) Prior Publication Data
US 2011/0229375 A1 Sep. 22, 2011

(30) Foreign Application Priority Data

Mar. 18, 2010 (DE) .......................... 10 2010 002 990

(51) Int. Cl.
*G01N 33/00* (2006.01)
*B32B 37/02* (2006.01)
*B32B 38/10* (2006.01)
*B01L 3/00* (2006.01)
*B81B 7/00* (2006.01)
*B32B 37/24* (2006.01)
*H01L 23/473* (2006.01)

(52) U.S. Cl.
CPC ......... *B01L 3/5027* (2013.01); *B01L 3/502707* (2013.01); *B81B 7/007* (2013.01); *B01J 2219/00783* (2013.01); *B01L 2200/027* (2013.01); *B01L 2300/0663* (2013.01); *B01L 2300/0874* (2013.01); *B01L 2300/0887* (2013.01); *B01L 2300/16* (2013.01); *B81B 2201/036* (2013.01); *B81B 2201/054* (2013.01); *B81B 2207/098* (2013.01); *B81C 2203/0154* (2013.01); *H01L 23/473* (2013.01); *Y10T 156/10* (2015.01)

(58) Field of Classification Search
USPC ................................................. 422/68.1, 502
See application file for complete search history.

(56) References Cited

U.S. PATENT DOCUMENTS

| 5,932,799 | A  | * | 8/1999  | Moles ........................... 73/53.01 |
| 6,453,928 | B1 | * | 9/2002  | Kaplan et al. .................... 137/14 |
| 6,548,895 | B1 | * | 4/2003  | Benavides et al. ............ 257/712 |
| 7,004,198 | B1 | * | 2/2006  | Okandan et al. .............. 137/827 |
| 7,371,538 | B2 | * | 5/2008  | Simpson et al. ............. 435/7.32 |
| 8,082,810 | B2 | * | 12/2011 | Moles ......................... 73/864.34 |

(Continued)

FOREIGN PATENT DOCUMENTS

DE           602 14 167 T2        7/2007

*Primary Examiner* — Jennifer Wecker
(74) *Attorney, Agent, or Firm* — Maginot, Moore & Beck LLP

(57) ABSTRACT

A microfluidic system for purposes of analysis and diagnosis is made up of layers arranged substantially one above the other. The microfluidic system includes at least a first and a second conducting-through layer, which respectively comprise at least one channel for a fluid to be conducted through in the respective conducting-through layer. The microfluidic system further includes at least one chip layer, which comprises at least one active, micromechanical element, the active, micromechanical element being in operative connection with at least one of the channels, and the chip layer being arranged between the first and the second conducting-through layer, and the channels being fluidically connected to one another. A corresponding production method is disclosed in addition to the microfluid system.

20 Claims, 8 Drawing Sheets

(56) References Cited

U.S. PATENT DOCUMENTS

| | | | |
|---|---|---|---|
| 8,137,641 B2* | 3/2012 | Moles | 422/504 |
| 2002/0112961 A1* | 8/2002 | O'Connor et al. | 204/601 |
| 2003/0226604 A1* | 12/2003 | Schlautmann et al. | 137/827 |
| 2008/0017306 A1* | 1/2008 | Liu et al. | 156/297 |
| 2008/0199362 A1* | 8/2008 | Chong et al. | 422/100 |
| 2011/0043937 A1* | 2/2011 | Juncker et al. | 359/846 |

* cited by examiner a)

b)

MICROFLUIDIC SYSTEM FOR PURPOSES OF ANALYSIS AND DIAGNOSIS AND CORRESPONDING METHOD FOR PRODUCING A MICROFLUIDIC SYSTEM

This application claims priority under 35 U.S.C. §119 to German patent application no. 10 2010 002 990.4, filed Mar. 18, 2010 in Germany, the disclosure of which is incorporated herein by reference in its entirety.

The present disclosure relates to a microfluidic system for purposes of analysis and diagnosis made up of layers arranged substantially one above the other and to a method for producing a microfluidic system.

Although it can be applied to various microfluidic systems, the present disclosure and the background on which it is based are explained with regard to microfluidic systems produced at least partially using silicon technology.

BACKGROUND

Microfluidic systems for analytical and diagnostic systems are also known, inter alia, as a "lab on chip" and are produced on glass or plastic substrates. The substrates in this case comprise channel or valve structures for fluids intended for analysis to be conducted through. Furthermore, active, micromechanical elements are arranged, such as for example pumps, etc., which are in operative connection with the channel or valve structures. The pumps serve, for example, for transporting or metering the fluid to which the channels are subjected.

For reasons of simplicity, microfluidic systems of this type are mainly produced using plastics technology, for example by means of injection molding or else by means of stamping or forming techniques. Furthermore, these microfluidic systems may also comprise structured metallic conductors and corresponding connections.

Microfluidic systems produced in this way are relatively inexpensive. However, the possible functions and application areas are restricted. For example, no optical analysis by means of CCD image sensors is possible. Furthermore, on account of the injection-molded plastics technique that is used, the production of the channel or valve structures is relatively inaccurate. The active, micromechanical elements, such as pumps or the like, are in this case produced from silicon and applied directly to corresponding openings of the channels, as are also corresponding electrical contacts for activating the active, micromechanical element on the substrate. The active, micromechanical elements are in this case arranged next to one another from above on the corresponding channels or the openings thereof and accordingly have in each case a channel gate or feed of their own. Furthermore, electrical contacts of an active, micromechanical element produced using silicon technology make complex and cost-intensive contacting methods necessary, since substrates of plastic and active, micromechanical elements of silicon have completely different tolerances and structural accuracies.

DE 602 14 167 T2 discloses a microfluidic system which comprises a number of layers stacked one above the other. Arranged in the respective layers are channels or chambers, which are produced by removing material over the entire thickness of the respective layer. This three-dimensional layer structure is used for the purpose of separating fluids.

SUMMARY

The microfluidic system set forth herein for purposes of analysis and diagnosis and the method set forth herein for producing a microfluidic system have the advantage that channels in different conducting-through layers are fluidically connected to one another and therefore active, in particular micromechanical elements are not restricted to a single conducting-through layer but can also be arranged one above the other in the form of a number of stacked chip layers and conducting-through layers. This has the effect of reducing the overall space requirement on the lowermost conducting-through layer. At the same time, the flexibility of the microfluidic system is increased considerably, since active, in particular micromechanical elements and channels no longer have to be respectively arranged substantially in just one layer, but instead complicated arrangements of channels are also possible. Finally, the method for producing a microfluidic system is simplified significantly, since channels which respectively interact with various active, in particular micromechanical elements no longer have to be connected by means of complex techniques, for example by structuring or by subsequent opening up. The number of openings in the lowermost conducting-through layer that is necessary for a connection of the active, in particular micromechanical elements is also reduced, since it is then possible, for example, by means of one channel for a number of further channels that are in operative connection with a number of active, in particular micromechanical elements to be subjected to a fluid.

Active elements should be understood in the present disclosure as meaning in particular both active, micromechanical elements and application-specific integrated circuits, known as ASICs.

According to a further preferred development, the microfluidic system comprises a second chip layer, the second chip layer being arranged on the first conducting-through layer, and the second chip layer comprising in particular at least one further active element, said element being in operative connection with at least the channel. The advantage here is that further active elements can be arranged without the space requirement on the lowermost conducting-through layer additionally increasing and that the first conducting-through layer can be created in the bonding layer, so that there is no need for an additional layer of adhesive to fix the second chip layer on the first conducting-through layer.

According to a further preferred development, a second conducting-through layer is arranged, comprising at least one channel, which is fluidically connected to the openings and/or channels of the substrate, the second conducting-through layer being arranged in particular below the substrate. The advantage here is that this allows the channels of the first conducting-through layer to be connected in a simple way to a further conducting-through layer, for example an already existing layer, to the channels thereof, without complex or additional connections having to be provided for this. This increases the flexibility of the microfluidic system.

According to a further preferred development, the chip layer and/or the active element in this case comprise at least one contact region for the electrical and/or fluidic contacting. The advantage of this is that this allows the active element and/or the chip layer to be electrically contacted in a simple way and at the same time to be correspondingly in operative connection with a fluid in a channel. If, for example, the chip layer comprises a pump, fluid in a channel can be pumped through the contact region for the fluidic contacting.

According to a further preferred development, the microfluidic system comprises a housing, in particular in the form of a molding compound. The advantage here is that the microfluidic system as a whole is protected from environmental influences. If the housing is in the form of a molding compound, simple and inexpensive protection of the microfluidic system is possible. A further advantage is that differences in tolerance and structural accuracy between connections for the active element in the chip layer and the plastic substrate that carries the lower conducting-through layer are moderated by the arrangement in a housing, since the connections no longer have to be applied directly to the plastic substrate but instead are applied by means of an appropriately adapted building-up and connecting technique. The molding compound may be an epoxy compound with silica fillers.

In particular in the area of medical technology, both the channels of the chip layers and conducting-through layers and/or the molding compound also comprise Parylene, which is an inert, hydrophobic, optically transparent, biocompatible material. In this case, the channels of the chip layers and conducting-through layers and/or the molding compound, in particular the regions of the molding compound that can be subjected to fluid, may be coated with Parylene. Furthermore, the molding compound may also comprise biocompatible plastics, such as for example cyclo-olefin copolymers, polycarbonates and/or cyclo-olefin polymers.

According to a further preferred development, the chip layer comprises silicon and at least one conducting-through layer comprises a plastic. The advantage here is that this achieves an overall increase in the accuracy and functional scope of the microfluidic system, for example it is thereby possible for fluids to be transported, prepared, analyzed and also evaluated.

According to a further preferred development, a contact layer and/or contact redistribution layer is arranged for the contacting of the chip layer and/or the active element. The advantage here is that the flexibility in the production of the microfluidic system is increased, since on the one hand a contact layer, for example in the form of a printed circuit board, can be used or on the other hand a contact redistribution layer, which can be made thin with respect to its thickness in the vertical direction, so that the space requirement of the microfluidic system is further reduced. At the same time, the microfluidic system can be adapted appropriately to the respective application.

According to a further preferred development, wire bonds and/or flip-chip contacts are arranged for the electrical connecting of the active element and/or the chip layer to a contact layer. The advantage here is that wire bonds make it possible very easily and inexpensively to carry out contacting of the active element and/or the chip layer with respect to a contact layer and contacting of a number of chip layers with respect to one another, whereas flip-chip contacts make possible a microfluidic system that is as compact as possible.

According to a further preferred development of the method, a second chip layer, comprising in particular an active element, is arranged on the first conducting-through layer, in particular in such a way that the active element is in operative connection with at least the channel. The advantage here is that this allows further chip layers, and consequently also possibly further elements, in particular active elements, to be arranged in a simple way without increasing the space requirement for this on the lowermost conducting-through layer. In addition, the flexibility of the microfluidic system is likewise increased, in that functions that require interaction of a number of active elements, for example a laser diode and a photodiode, which measures a transmission of light of the laser diode through a fluid, are then also possible by the arrangement of a number of chip layers one above the other. If the chip layer consists of silicon, the channels of the chip layers can, for example, be produced by means of trenching already on a wafer production level.

According to a further preferred development, a second conducting-through layer, comprising at least one channel, is arranged in such a way that said channel is fluidically connected to the openings and/or channels of the substrate, the second conducting-through layer being arranged in particular below the substrate. The advantage here is that this allows the channels of the first conducting-through layer to be connected in a simple way to a further conducting-through layer, for example an already existing layer, to the channels thereof, without complex connections having to be provided for this. This increases the flexibility of the microfluidic system.

The active element and/or the chip layer may be contacted by means of wire bonds and/or the flip-chip technique and/or a contact redistribution layer. The advantage here is that wire bonds make particularly easy contacting possible. Contacting by means of the flip-chip technique, like contacting by means of a contact redistribution layer, makes a particularly compact configuration of the microfluidic system possible.

According to a further preferred development, the creation of the channel of the first conducting-through layer and/or the fixing of the first conducting-through layer is performed by means of at least partial removal of a bonding layer. The advantage here is that the bonding layer that can be used for fixing the first conducting-through layer at the same time also comprises at least one channel for a fluid to be conducted through. This dispenses with the need for an additional bonding layer for creating the channel, and the production method is thereby simplified further.

According to a further preferred development, in a further step, the microfluidic system is provided with a housing, in particular by means of transfer molding or injection molding. The advantage here is that the microfluidic system can be protected particularly easily and inexpensively.

BRIEF DESCRIPTION OF THE DRAWINGS

Exemplary embodiments of the disclosure are represented in the drawings and explained in more detail in the description which follows.

In the drawings.

DETAILED DESCRIPTION

Figure 1:
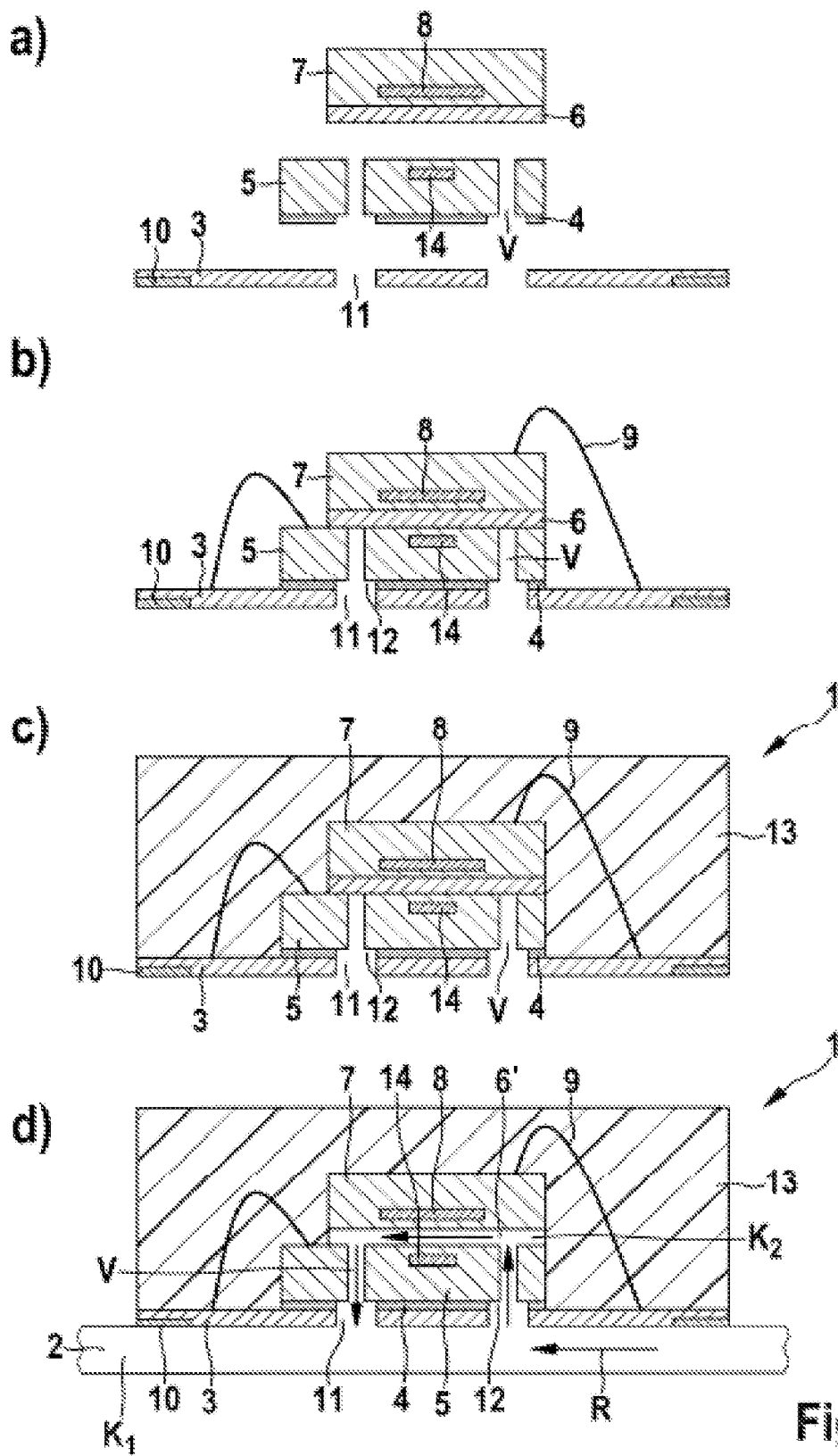
FIGS. 1a-d show steps of a method for producing a microfluidic system according to a first embodiment in cross section.

FIG. 1 shows steps of a method for producing a microfluidic system according to a first embodiment.

In FIGS. 1a-d, reference sign 1 denotes a microfluidic system. Also shown in FIG. 1 is a substrate 3, which has openings 11 for the flowing through of a fluid F. Furthermore, the substrate 3 has contact pads 10 for the electrical contacting of the substrate 3. According to FIG. 1, a chip layer 5, consisting of silicon, is arranged on an upper side of the substrate 3. The chip layer 5 has on its underside an adhesive layer 4 for fixing the chip layer 5 on the substrate 3. The adhesive layer 4 also has through-openings 12, corresponding to the through-openings 11. The chip layer 5 is formed as a flow sensor and has a sensing area 14 for the flow sensor. The flow sensor is in operative connection with a channel $K_2$, still to be created, of a first conducting-through layer 6'. Respectively to the sides of the sensing area 14, channels V for a fluid F to be conducted through extend in the vertical direction. The channels V were opened up by trenching the silicon and correspond to the through-openings 11, 12.

Arranged on the chip layer 5 is a second chip layer 7, which is formed as a second active element in the form of a pump 8. This second chip layer 7 is fixed onto the upper side of the first chip layer 5 by means of a bonding layer 6. The through-openings 11, 12 in the substrate 3 and in the adhesive layer 4 accordingly correspond to the channels V, in order to allow the channel $K_2$ to be subjected to a fluid F from a second conducting-through layer 2 with channels $K_1$. Once the substrate 3 is connected to the adhesive layer 4, the first chip layer 5, the first conducting-through layer 6 and the second chip layer 7, the first chip layer 5 and the second chip layer 7 are connected to the substrate 3 by means of wire bonds 9. Subsequently, according to FIG. 1c, the layers 3, 4, 5, 6, 7 stacked in this way are packaged in a molding compound 13.

In a final step, according to FIG. 1d, a bonding layer 6 between the first chip layer 5 and the second chip layer 7 is removed at least partially, here completely, by thermal, chemical or physical decomposition, so that the channel $K_2$ forms as a result. Subsequently, the packaged microfluidic system 1 is applied to a plastic substrate that forms the second conducting-through layer 2, which comprises further fluidic channels $K_1$, in such a way that the channels $K_1$ are in fluidic connection with the channel $K_2$ by way of the connection V and the through-openings 11, 12. The fluid F can then flow through the microfluidic system 1 in direction R through the channels $K_1$, the channels V and the channel $K_2$.

Figure 2:
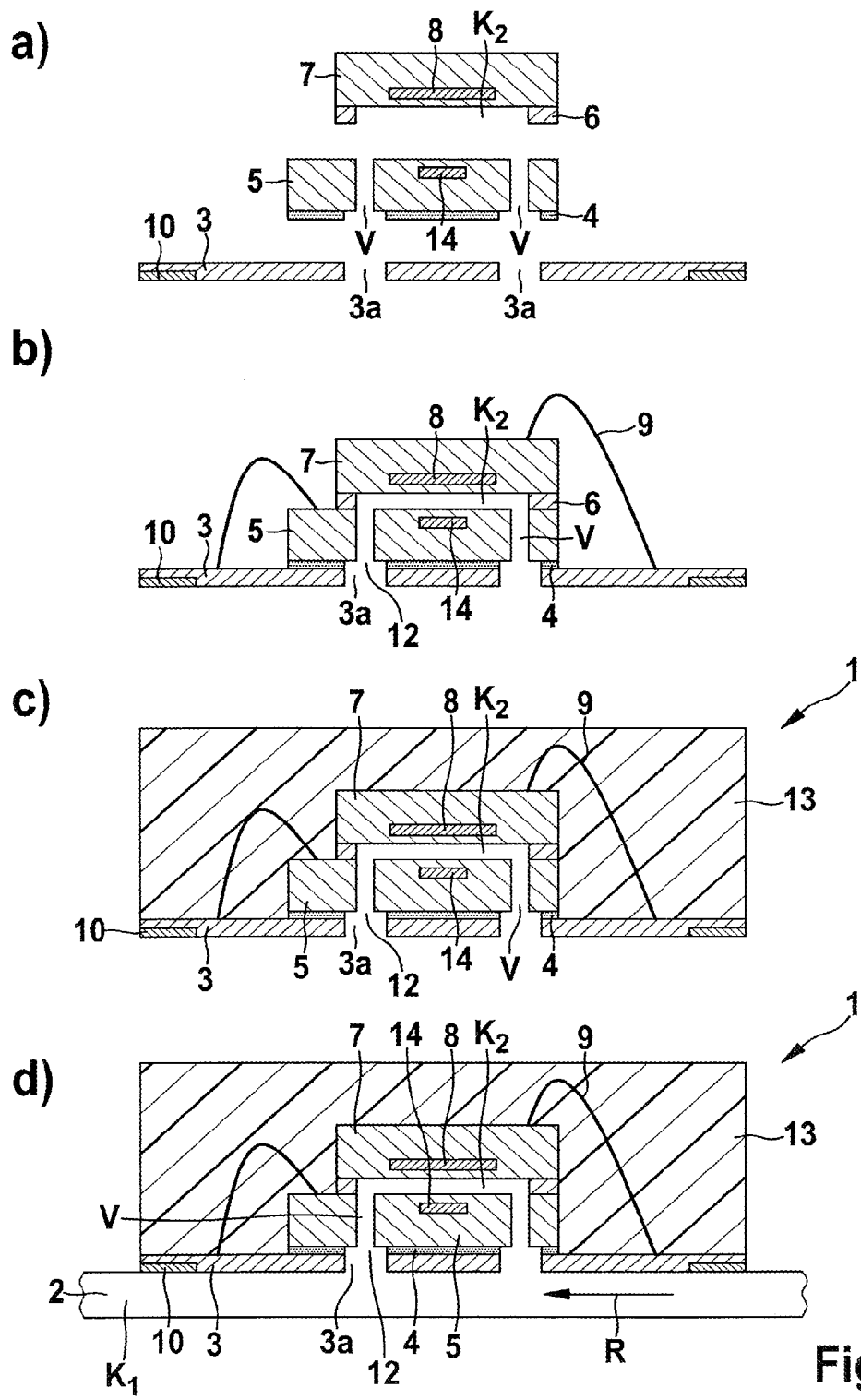
FIGS. 2a-d show steps of a method for producing a microfluidic system of a second embodiment in cross section.

FIG. 2 shows steps of a method for producing a microfluidic system of a second embodiment in cross section.

FIG. 2 shows a substantially analogous embodiment of a microfluidic system according to FIG. 1. As a difference from FIG. 1, however, before the chip layers 5, 7 and the conducting-through layers 2, 6 are brought together vertically, the bonding layer 6 of FIG. 2a is structured, in order to create at least one channel $K_2$. The further production of the microfluidic system 1 according to FIGS. 2b-d is then performed in an analogous way according to FIGS. 1b-d, without the step of the subsequent partial removal of the bonding layer 6 according to FIG. 1d.

Figure 3:
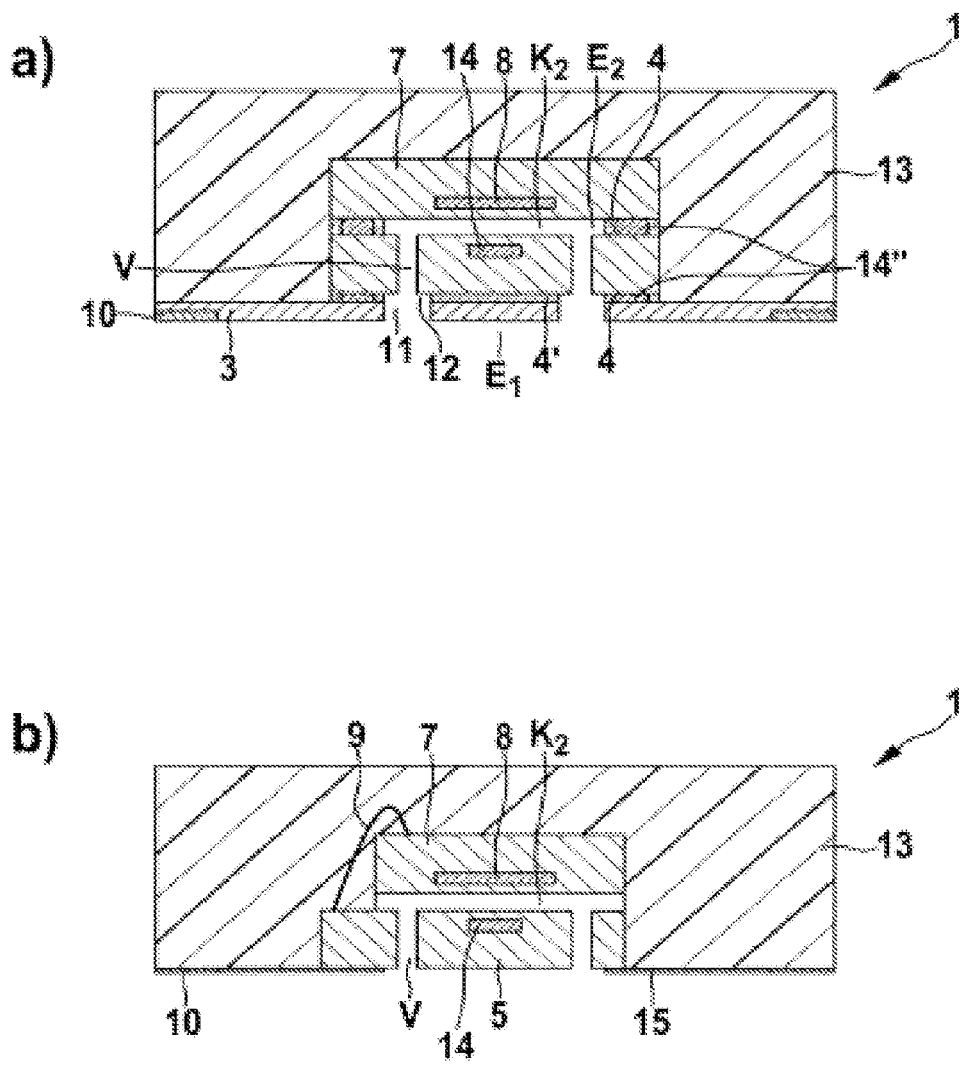
FIGS. 3a,b show microfluidic systems according to a third and fourth embodiment in cross section.

FIG. 3 shows microfluidic systems according to a third and fourth embodiment in cross section.

FIG. 3a likewise shows a microfluidic system substantially analogous to that of FIG. 1. As a difference from the microfluidic system 1 according to FIG. 1 and FIG. 2, however, instead of the wire bonds 9 arranged for the contacting, the two chip layers 5, 7 are electrically contacted by means of flip-chip contacts 14". The flip-chip contacts 14" are in this case respectively arranged between the chip layers 5, 7 and between the chip layer 5 and the substrate 3. In order to insulate the flip-chip contacts 14", underfillers 4' are applied in a structured form around the flip-chip contacts 14". At the same time, the underfillers 4' together with the flip-chip contacts 14" keep the two chip layers 5, 7 at a distance from one another, and similarly keep the substrate 3 at a distance from the first chip layer 5. In this way, at least one channel $K_2$ for fluids F to be conducted through is obtained between the chip layers 5, 7. Alternatively, a bonding sacrificial layer could also be applied, serving as a flow stop for the underfillers 4'. The bonding sacrificial layer may then be removed again after packaging 13 of the microfluidic system 1.

In FIG. 3b, there is then shown a microfluidic system 1 that has no substrate 3. During the production of this microfluidic system, a temporary carrier with an adhesive film is used instead of the substrate 3. The electrical contacting of the first chip layer 5 is performed in this case by means of a thin contact redistribution layer 15, which is arranged on the underside of the chip layer 5, at the left and right edges thereof, and on the peripheral molding compound 13. Thereafter, the microfluidic system 1 is applied to a plastic substrate 2 with channels $K_1$ according to FIG. 1d.

A "pick-and-place" production method such as this establishes both a mechanically stable connection and electrical and fluidic contacting. This mechanical or electrical contacting may in this case be performed by means of adhering, welding or soldering techniques. Furthermore, it is within the scope of the disclosure to use the plastic substrate 2 with the channels $K_1$ already during the vertical assembly, that is to say at an early point in time in the production of the microfluidic system 1, of the individual conducting-through layers $E_1$, $E_2$ and chip layers 5, 7, so that a laminate produced in this way from conducting-through layers $E_1$, $E_2$ and chip layers 5, 7 together with a plastic substrate 2 is subsequently overmolded altogether with a molding compound 13. The electrical connections of contacts of the microfluidic system 1 can then be led as interconnects to a terminal strip (not shown), for example on an upper side of the plastic substrate 2, which may have further channels $K_1$.

Figure 4:
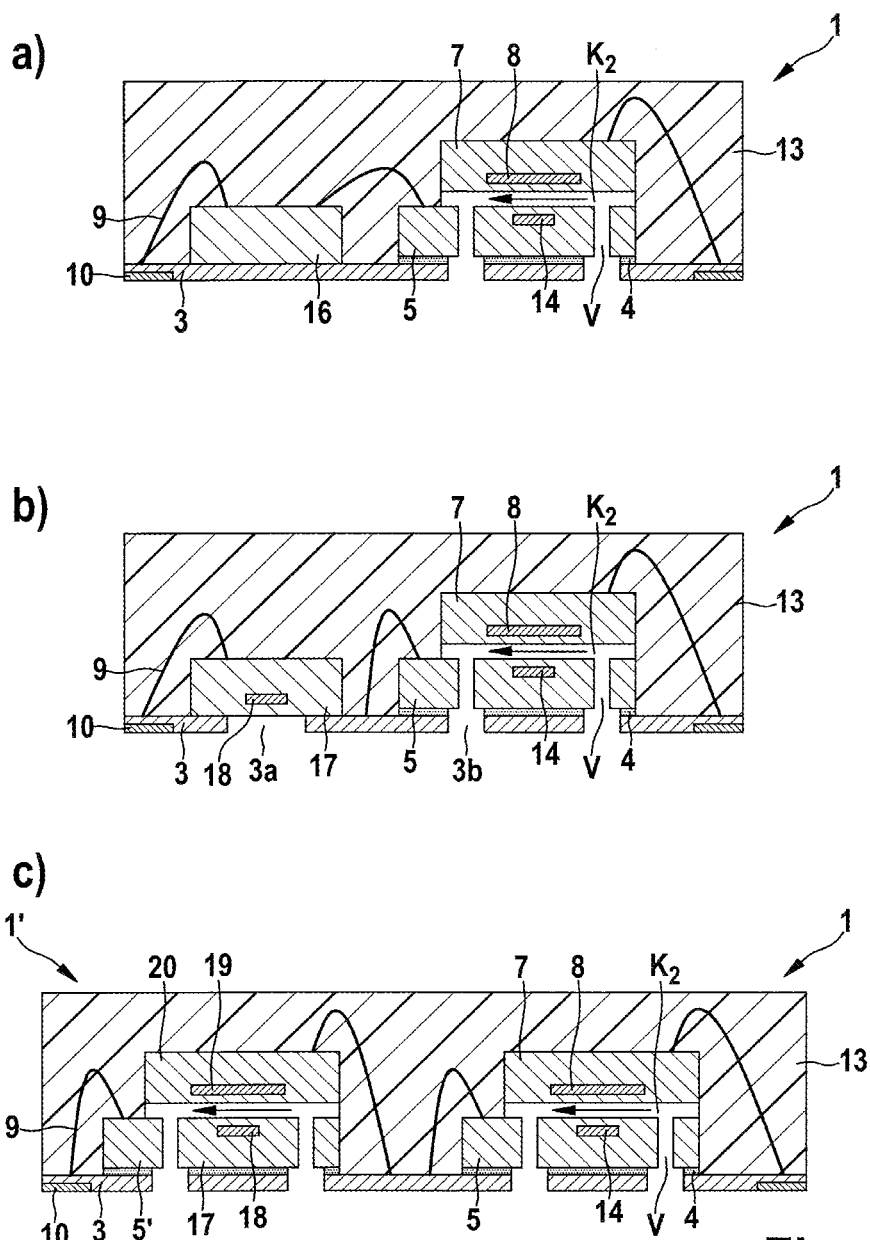
FIG. 4 shows a microfluidic system according to the first embodiment in interaction with further fluidic systems or active, micromechanical elements in cross section.

FIG. 4 shows a microfluidic system according to the first embodiment in interaction with further fluidic systems or active, micromechanical elements.

FIGS. 4a-c show a microfluidic system 1 according to FIG. 1. In FIG. 4a, an active element in the form of an application-specific integrated circuit 16 is arranged on the substrate 3 to the left of the microfluidic system 1. The application-specific integrated circuit 16 is in this case connected to the substrate 3 on the one hand and the first chip layer 5 on the other hand by means of wire bonds 9.

In FIG. 4b, instead of the application-specific integrated circuit 16, a further chip layer 17 is arranged, formed as an active element in the form of a heating element 18. The heating element 18 is in this case in operative connection with channels $K_1$ of a plastic substrate (not shown) by way of an opening 3a of the substrate 3. The electrical contacting of the chip layer 17 is performed in this case in turn by means of a wire bond 9 with respect to the substrate 3. Both the chip layer 17 and the microfluidic system 1 are in this case connected to channels of a plastic substrate (not shown) by way of through-openings 3a, 3b.

FIG. 4c then shows two microfluidic systems 1, 1', which have substantially the same structure. The microfluidic system 1' differs from the microfluidic system 1 merely in that, instead of being formed as a flow sensor 14 and a pump 8, the chip layers 5', 20 corresponding to the chip layers 5, 7 are formed as a heating element 18 and an analyzing device 19. The electrical contacting of the chip layers 5', 20 is performed in turn by means of wire bonds 9 between the substrate 3 and the respective chip layer 5', 20.

Figure 5:
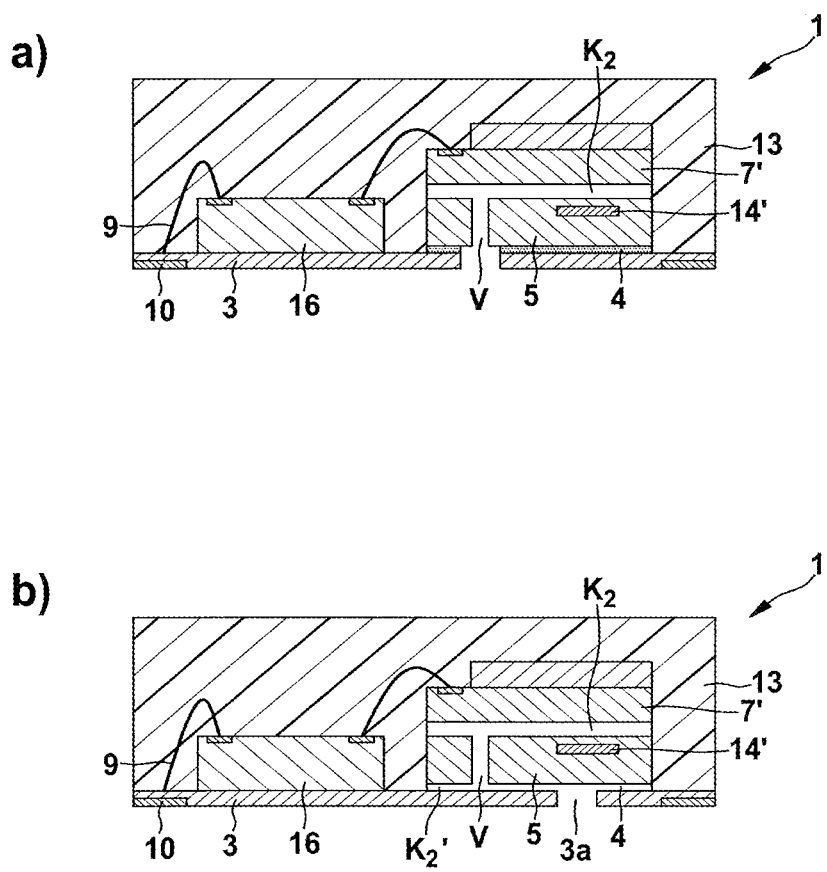
FIGS. 5a,b show two microfluidic systems according to a fifth and a sixth embodiment in cross section.

FIG. 5 shows two microfluidic systems according to a fifth and a sixth embodiment in cross section.

FIG. 5a shows substantially an arrangement with a microfluidic system 1 according to FIG. 4a, one difference from the microfluidic system 1 of FIG. 4a being that just a single channel V is arranged for the fluidic connection of channels $K_1$ of a plastic substrate (not shown) to the channels $K_2$. A further difference from the microfluidic system 1 according to FIG. 4a is that the respective chip layer is formed as a pressure sensor 14' instead of the flow sensor 14 and as an acceleration sensor 7 instead of being formed as a pump 8; the channel $K_2$ serves in this case for applying pressure to the pressure membrane (not shown) of the pressure sensor 14. The chip layer 5 is in this case fixed on the substrate 3 by means of an adhesive layer 4.

FIG. 5b shows substantially a microfluidic system 1 according to FIG. 5a. Channels $K_1$ of a plastic substrate 2 are in this case in fluidic connection with channels $K_{2'}$, created by decomposition of the adhesive layer 4, by way of the opening 3a of the substrate 3. These channels $K_{2'}$ are also fluidically connected to the channels V, $K_2$. In FIGS. 5a,b, the contacting of the pressure sensor 14 in the chip layer 5 is performed by way of a lateral overhang (not shown here) and by means of a wire bonding technique.

Figure 6:
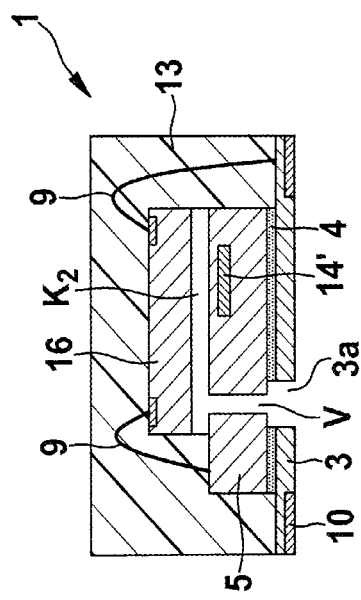
FIGS. 6a,b show a microfluidic system according to a seventh embodiment in cross section.
Figure 6:
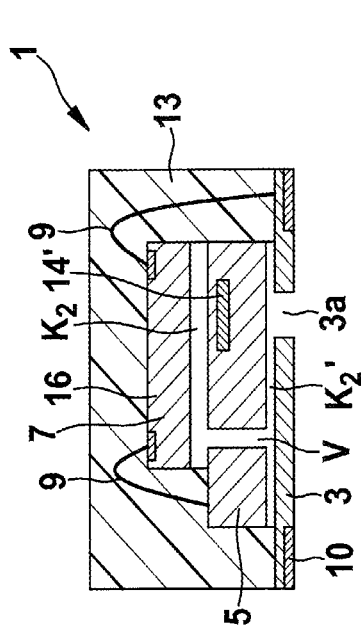
Figure 6:
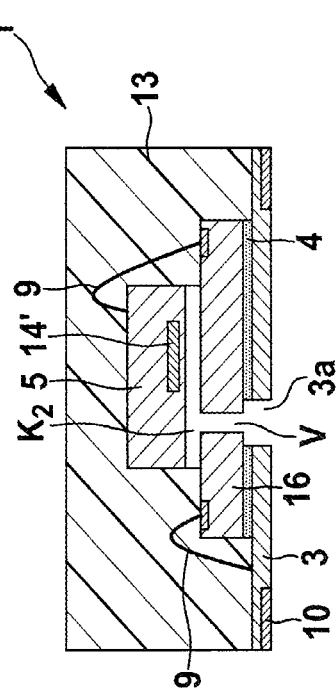
Figure 6:
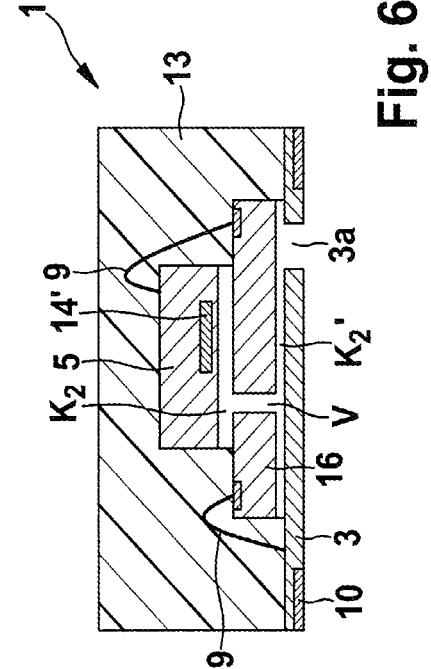

FIG. 6 shows a microfluidic system according to a seventh embodiment in cross section.

In FIG. 6a, a microfluidic system 1 substantially analogous to the microfluidic system according to FIG. 5a is shown. The microfluidic system 1 in this case comprises two chip layers 5 and 7. The first chip layer 5 is in this case formed as a pressure sensor 14' and the second chip layer 7 is formed as an application-specific integrated circuit 16. The application-specific integrated circuit 16 is in this case connected to the first chip layer 5 on the one hand and the substrate 3 on the other hand by means of wire bonds 9. In FIG. 6b, it is merely that the chip layers 5 and 7 of the microfluidic system have been changed over. On the left in FIG. 6a and on the left in FIG. 6b, the first chip layer 5 is fixed on the substrate 3 by means of an adhesive layer 4, whereas, on the right in FIG. 6a and on the right in FIG. 6b, the adhesive layer 4 has been opened up by decomposition, analogous to the microfluidic system 1 according to FIG. 5b, thereby forming a horizontal channel $K_{2'}$, which connects the opening 3a of the substrate 3, which in turn is in fluidic connection with channels $K_1$ of a plastic substrate (not shown), with the channel V and the channel $K_2$.

Figure 7:
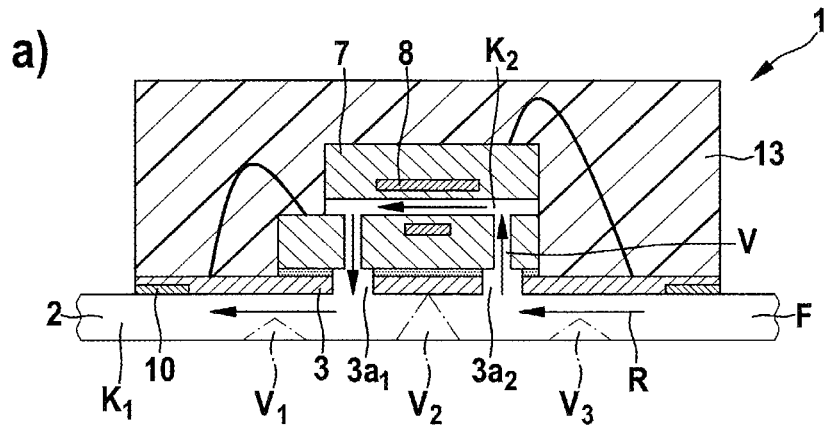
FIG. 7 shows a microfluidic system according to an eighth embodiment in cross section.
Figure 7:
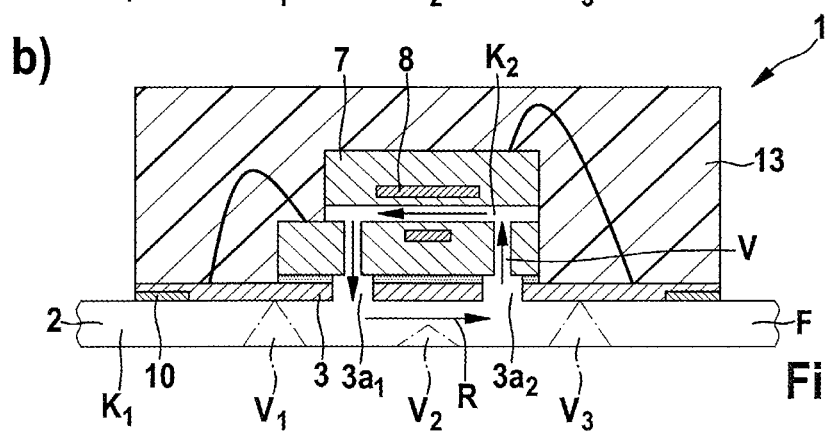

FIG. 7 shows a microfluidic system according to an eighth embodiment in cross section.

FIG. 7a shows a microfluidic system 1 according to FIG. 1d. The plastic substrate 2 in this case comprises three valves $V_1$, $V_2$ and $V_3$. FIG. 7a then shows a state in which the valves $V_1$, $V_3$ are open and the valve $V_2$ is closed. With a closed valve $V_1$, $V_2$ and $V_3$, a fluid F cannot flow from right to left in the horizontal channels $K_1$ of the plastic substrate 2. Furthermore, the valve $V_2$ is in this case arranged between two openings $3a_1$, $3a_2$ of the substrate 3, which are in fluidic connection with the channels $K_1$, $K_2$, V. If a fluid F then flows in direction R, therefore according to FIG. 7a from right to left in the channels $K_1$ of the plastic substrate 2, it thereby initially passes the open valve $V_3$ and then meets the closed valve $V_2$. The closed valve $V_2$ forces the fluid F by way of the opening $3a_2$ into a vertical channel V of the chip layer 5. The fluid F then flows further through the channel $K_2$ between the chip layers 5, 7 and by way of a further vertical channel V of the chip layer 5 and by way of the opening $3a_1$ of the substrate 3 back into channels $K_1$ of the plastic substrate 2. On account of the closed valve $V_2$, the fluid F cannot flow back in the direction of the valve $V_3$, and therefore then flows further from right to left and passes the open valve $V_1$.

In FIG. 7b, a state of the valves $V_1$, $V_2$ and $V_3$ in which the valve $V_2$ is open and the valves $V_1$ and $V_3$ are closed is shown. The pump 8 can then pump the fluid F in the channels $K_1$, V, $K_2$, so that a circulation of the fluid F is made possible. In this way it is possible for the direction of flow of the fluid F to be controlled on the basis of the valves $V_1$-$V_3$. Thus, fluidic loops, that is to say repeated flowing through of the channels $K_1$, $K_2$, V, are possible, without special channels having to be arranged for this. This is used in the area of medical technology, for example in the form of a heatable reaction chamber for reproducing DNA structures.

Figure 8:
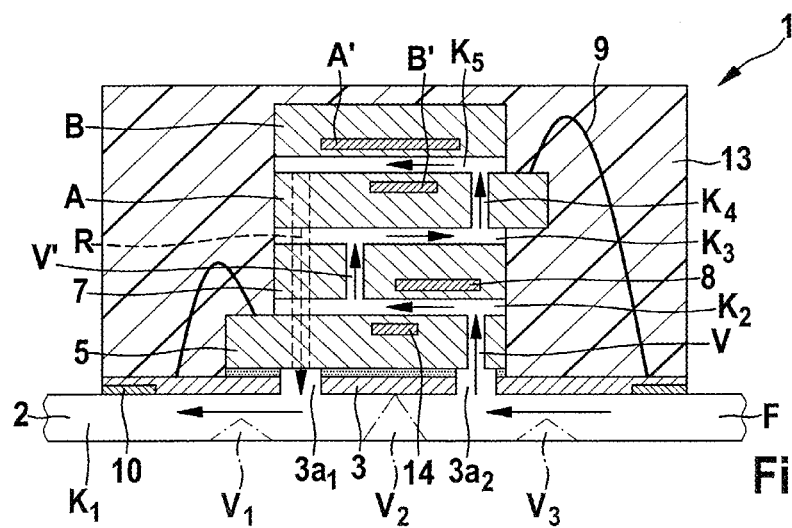
FIG. 8 shows a microfluidic system according to a ninth embodiment with a number of conducting-through layers and chip layers in cross section.

FIG. 8 shows a microfluidic system according to a ninth embodiment with a number of conducting-through layers and chip layers in cross section.

In FIG. 8, a microfluidic system 1 comprising four chip layers 5, 7, A, B is shown, arranged substantially stacked one above the other in a housing 13. Between the chip layers 5 and 7 as well as 7 and A and A and B, there run horizontal channels $K_2$, $K_3$ and $K_5$. The horizontally running channels $K_2$, $K_3$ and $K_5$ according to FIG. 8 are fluidically connected to the channels $K_1$ of the plastic substrate 2 by way of vertical channels V, V', $K_4$, which run within the respective chip layer 5, 7, A. In this case, the chip layers 5, 7, A, B, formed as active elements 14, 8, A', B', are respectively in operative connection with the respective channels $K_2$, $K_3$ and $K_5$. The chip layer 5 and the chip layer A are in this case electrically connected to the substrate 3 by means of wire bonds 9.

A fluid F then flows, for example, with open valves $V_1$, $V_3$ and closed valve $V_2$ by way of through-openings $3a_2$ of the substrate 3 into a vertical channel V and further into the channel $K_2$, the channel V', the channel $K_3$, the channel $K_4$ and the channel $K_5$. In order to return the fluid F from the channel $K_5$ between the two uppermost chip layers A, B into the channels $K_1$ of the plastic substrate 2 again, a return channel R is arranged (shown by dashed lines in FIG. 8), which extends in the vertical direction through the chip layers A, 7 and 5 and is fluidically connected to the channels $K_1$ by way of a through-opening $3a_1$ of the substrate 3. The closed valve $V_2$ prevents the fluid F from flowing back.

The chip layers 5, 7, A, B according to FIG. 8 are in this case respectively formed as active elements 14, 8, A', B'. The active element 14 according to FIG. 8 is a flow sensor, the active element 8 according to FIG. 8 is a pump, the active element A' is a marker and the active element B' is a CCD camera. Altogether, FIG. 8 shows an enclosed, integrated, diagnostic module with sample transport of a fluid in the chip layer 5, 7, sample preparation of a fluid F in the chip layer A and sample analysis of the fluid F by means of the chip layer B on the basis of the CCD camera B'. By suitable opening and closing of the valves $V_1$, $V_2$ and $V_3$, a defined sample amount of the fluid F can be pumped into an analysis space $K_5$ and the sample can be prepared by means of the active, micromechanical element A', for example by attachment of fluorescent particles to specific constituents of the fluid F. The content thereof can then be analyzed, for example by means of the CCD camera B'.

In order to increase the functional scope of the individual chip layers 5, 7, A, B or the application area of the microfluidic system, a number of active elements 14, 8, A', B' may be arranged in a single chip layer, so that there is no need for additional chip layers.

Figure 9:
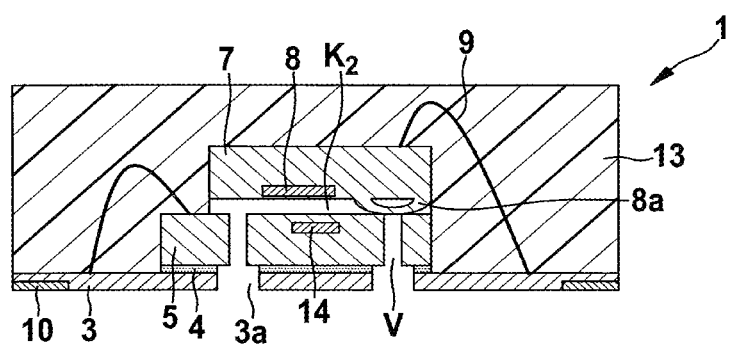
FIG. 9 shows a microfluidic system according to a tenth embodiment with a valve structure in cross section.

FIG. 9 shows a microfluidic system according to a tenth embodiment with a valve structure in cross section.

FIG. 9 shows substantially a microfluidic system according to FIG. 1d. The chip layer 7, formed as a pump 8, now comprises a valve structure 8a, which, when correspondingly actuated, for example by a piezo element or a piezo valve, can close off the vertical channel V, represented in FIG. 9, from the channel $K_2$, in which the valve 8a closes the opening of the connection between the channels V and $K_2$.

Figure 10:
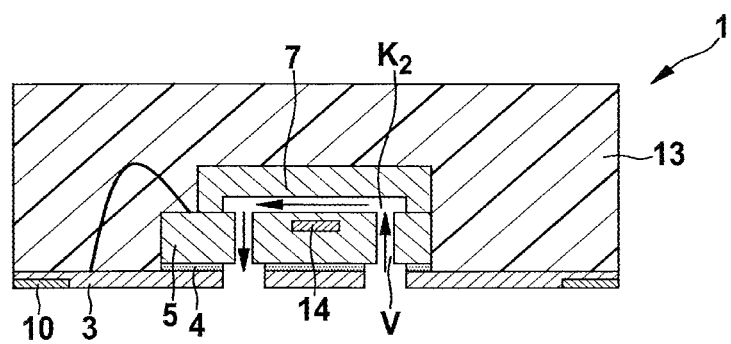
FIG. 10 shows a microfluidic system according to an eleventh embodiment in cross section.

FIG. 10 shows a microfluidic system according to an eleventh embodiment in cross section.

FIG. 10 shows substantially a microfluidic system 1 according to FIG. 1d. As a difference from FIG. 1d, the chip layer 7 is not formed as a chip layer with an active, micromechanical element, but instead substantially comprises a cap placed on the channels V from above. The cap is in this case pre-structured with channels $K_2$, so that a fluid F can flow from a channel V by way of the channel $K_2$ and further by way of a further channel V. The channel $K_2$ between the chip layers 5, 7 is in this case formed by a cavity in the cap 7.

Within the scope of the disclosure, the chip layers may have electronics, in particular in the form of application-specific integrated circuits. Furthermore, within the scope of the disclosure, the active elements may be formed in particular in the form of heating elements, pumps, pressure or acceleration sensors, analytical systems, in particular CCD cameras, marker, mixer or filter elements, and multiple modules, comprising fluidic and/or inertial components or sensors.

Although the present disclosure has been described above on the basis of preferred exemplary embodiments, it is not restricted to these but instead can be modified in many various ways.

What is claimed is:

1. A microfluidic system for use in analysis and diagnosis, comprising:
   a substrate in the form of a contact redistribution layer defining an opening configured for fluid to be conducted through;
   a first conducting-through layer defining a conducting channel configured for fluid to be conducted through; and
   a first chip layer including at least one active element at least partially embedded in the first chip layer, the at least one active element being adjacent and subjected to the fluid conducted through the conducting channel, and the first chip layer being arranged between the first conducting-through layer and the substrate,
   wherein the first chip layer defines a passage spaced apart from the active element and extending through an entire width of the first chip layer to fluidly connect the opening of the substrate to the conducting channel of the first conducting-through layer.

2. A microfluidic system for use in analysis and diagnosis comprising:
   a substrate in the form of a contact redistribution layer defining an opening configured for fluid to be conducted through;
   a first conducting-through layer defining a conducting channel configured for fluid to be conducted through;
   a first chip layer including at least one active element, the at least one active element being adjacent and subjected to the fluid conducted through the conducting channel, and the first chip layer being arranged between the first conducting-through layer and the substrate; and
   a second chip layer arranged on a side of the first conducting-through layer opposite the first chip layer, the second chip layer comprising at least one further active element, and the at least one further active element being adjacent and subjected to the fluid conducted through the conducting channel,
   wherein the first chip layer defines a passage spaced apart from the active element, the passage fluidically connecting the opening of the substrate to the conducting channel of the first conducting-through layer.

3. A microfluidic system for use in analysis and diagnosis comprising:
   a substrate in the form of a contact redistribution layer defining an opening configured for fluid to be conducted through;
   a first conducting-through layer defining a first conducting channel configured for fluid to be conducted through;
   a first chip layer which comprises at least one active element, the at least one active element being adjacent and subjected to the fluid conducted through the first conducting channel, and the first chip layer being arranged between the first conducting-through layer and the substrate; and
   a second conducting-through layer comprising a second conducting channel fluidically connected to the opening of the substrate, the second conducting-through layer being arranged on a side of the substrate opposite the first chip layer,
   wherein the first chip layer defines a passage spaced apart from the active element, the passage fluidically connecting the opening of the substrate to the first conducting channel of the first conducting-through layer, and
   wherein the fluid is conducted in sequence from the second conducting-through layer to the opening of the substrate, through the passage in the first chip layer, and into the first conducting-through layer.

4. The microfluidic system according to claim 1, wherein:
   at least one of the chip layer and the active element includes at least one contact region configured for at least one of electrical and fluidic contacting.

5. The microfluidic system according to claim 2, further comprising:
   a housing in the form of a molding compound,
   wherein the first chip layer, the second chip layer, and the first conducting-through layer are embedded within the housing, and
   wherein the housing is in contact with a top surface of the substrate.

6. The microfluidic system according to claim 1, wherein:
   the first chip layer comprises silicon, and
   the first conducting-through layer comprises a plastic.

7. The microfluidic system according to claim 1, wherein the contact redistribution layer is arranged to contact the first chip layer.

8. The microfluidic system according to claim 5, further comprising:
   at least one of wire bonds and flip-chip contacts extending through the housing to electrically connect at least one of the active element and the chip layer to the substrate.

9. A method for producing a microfluidic system, comprising:
   creating an opening configured for fluids to be conducted through in a substrate, which is in the form of a contact redistribution layer;
   creating a first vertical channel configured for fluids to be conducted through in a chip layer, the chip layer comprising at least one active element at least partially embedded in the chip layer, and the first channel being created spaced apart from the at least one active element and extending through an entire width of the chip layer;
   fixing the chip layer on the substrate in such a way that the opening is fluidically connected to the first channel of the chip layer, fixing a first conducting-through layer on a side of the chip layer opposite the substrate; and creating a conducting channel in the first conducting-through layer in such a way that the first channel of the chip layer fluidically connects the conducting channel of the first conducting-through layer to the opening in the substrate, the conducting channel being created in such a way that the active element is subjected to fluid conducted through the first conducting through layer.

10. A method for producing a microfluidic system comprising:

creating an opening configured for fluids to be conducted through in a substrate, which is in the form of a contact redistribution layer;

creating a first channel configured for fluids to be conducted through in a first chip layer, the first chip layer comprising at least one first active element, and the first channel being created outside the at least one first active element;

fixing the first chip layer on the substrate in such a way that the opening is fluidically connected to the first channel of the first chip layer;

fixing a first conducting-through layer on a side of the first chip layer opposite the substrate;

creating a conducting channel in the first conducting-through layer in such a way that the first channel of the first chip layer fluidically connects the conducting channel of the first conducting-through layer to the opening in the substrate, the conducting channel being created in such a way that the first active element is subjected to fluid conducted through the first conducting through layer; and arranging a second active element of a second chip layer on the first conducting-through layer in such a way that the second active element is in operative connection with and subjected to the fluid conducted through the conducting channel of the first conducting-through layer.

11. A method for producing a microfluidic system comprising:

creating an opening configured for fluids to be conducted through in a substrate, which is in the form of a contact redistribution layer;

creating a first channel configured for fluids to be conducted through in a first chip layer, the first chip layer comprising at least one first active element, and the first channel being created outside the at least one first active element;

fixing the first chip layer on the substrate in such a way that the opening is fluidically connected to the first channel of the first chip layer;

fixing a first conducting-through layer on a side of the first chip layer opposite the substrate;

creating a first conducting channel in the first conducting-through layer in such a way that the first channel of the first chip layer fluidically connects the first conducting channel of the first conducting-through layer to the opening in the substrate; and arranging a second conducting channel of a second conducting-through layer in such a way that the second conducting channel is fluidically connected to the opening in the substrate, the second conducting-through layer being arranged on a side of the substrate opposite the first chip layer, wherein the second conducting channel, the opening, the passage, and the first conducting channel are created so as to form a fluid conduction path from the second conducting channel to the opening of the substrate, through the passage in the first chip layer, and into the first conducting channel.

12. A method for producing a microfluidic system comprising:

creating an opening configured for fluids to be conducted through in a substrate, which is in the form of a contact redistribution layer;

creating a first channel configured for fluids to be conducted through in a first chip layer, the first chip layer comprising at least one first active element, and the first channel being created outside the at least one first active element;

fixing the first chip layer on the substrate in such a way that the opening is fluidically connected to the first channel of the first chip layer;

fixing a bonding layer on a side of the first chip layer opposite the substrate; and removing at least a portion of the bonding layer to form a conducting channel in a first conducting-through layer in such a way that the first channel of the first chip layer fluidically connects the conducting channel of the first conducting-through layer to the opening in the substrate.

13. The method according to claim 9, further comprising:

creating a housing by transfer molding or injection molding, the substrate, the first chip layer, and the first conducting-through layer being embedded in said housing.

14. The microfluidic system of claim 2, wherein the at least one active element includes a flow sensor and the at least one further active element includes a fluid pump.

15. The method of claim 10, wherein the at least one active element includes a flow sensor and the at least one further active element includes a fluid pump.

16. The method according to claim 12, wherein the creation of the conducting channel includes at least partially removing of the bonding layer after fixing the first conducting-through layer on the first chip layer.

17. The microfluidic system of claim 2, further comprising:

an adhesive layer interposed between the substrate and the first chip layer configured to bond the first chip layer to the substrate.

18. The microfluidic system of claim 1, wherein the first conducting through layer, the first chip layer, and the substrate are all in planes that are substantially parallel to one another.

19. The microfluidic system of claim 1, wherein the passage is oriented substantially perpendicular with respect to the conducting channel.

20. The microfluidic system of claim 1, wherein:

the first chip layer defines a further passage fluidically connecting the opening of the substrate to the first conducting channel of the first conducting-through layer, and the conducting channel includes an inlet end directly fluidly connected to the passage and an outlet end directly fluidly connected to the further passage.

* * * * *